(12) United States Patent
Kresge

(10) Patent No.: US 6,483,074 B2
(45) Date of Patent: Nov. 19, 2002

(54) LASER BEAM SYSTEM FOR MICRO VIA FORMATION

(75) Inventor: John S. Kresge, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 09/802,054

(22) Filed: Mar. 7, 2001

(65) Prior Publication Data

US 2002/0125221 A1 Sep. 12, 2002

(51) Int. Cl.[7] ................................................ B23K 26/38
(52) U.S. Cl. ..................................................... 219/121.7
(58) Field of Search ......................... 219/121.6, 121.67, 219/121.68, 121.69, 121.7, 121.71, 121.73

(56) References Cited

U.S. PATENT DOCUMENTS

| | | | |
|---|---|---|---|
| 4,128,752 A | 12/1978 | Gravel | |
| 5,055,653 A | 10/1991 | Funami et al. | |
| 5,539,175 A | 7/1996 | Smith et al. | |
| 5,657,138 A | 8/1997 | Lewis et al. | |
| 5,776,220 A | * 7/1998 | Allaire et al. | 65/112 |
| 5,826,772 A | * 10/1998 | Ariglio et al. | 225/2 |
| 6,040,552 A | 3/2000 | Jain et al. | |

FOREIGN PATENT DOCUMENTS

| | | |
|---|---|---|
| JP | 62104692 | 5/1987 |
| JP | 3052790 | 3/1991 |
| JP | 10034365 | 2/1998 |

* cited by examiner

*Primary Examiner*—Samuel M. Heinrich
(74) *Attorney, Agent, or Firm*—Schmeiser, Olsen & Watts; Lawrence R. Fraley

(57) ABSTRACT

A laser system for micro via formation directly over a plated through hole (PTH). The laser system forms the micro via directly over the PTH with full dielectric removal from a capture pad while minimizing the dielectric removal from a center portion of the PTH.

24 Claims, 6 Drawing Sheets

LASER BEAM SYSTEM FOR MICRO VIA FORMATION

BACKGROUND OF THE INVENTION

1. Technical Field

The present invention relates to a via formation system and more particularly to a laser system used for forming a micro via.

2. Related Art

FIGS. 1–5 illustrate a related art method of forming a microvia over a plated through hole (PTH) of a substrate. In particular, FIG. 1 illustrates a cross sectional view of a related art substrate 12, having a PTH 10 formed therein. The PTH 10 includes an opening 14 and a capture pad 16 formed using conventional techniques. As illustrated in FIG. 2, a dielectric material 18 is deposited within the opening 14 of the PTH 10, filling the opening 14 of the PTH 10, and coating a lower surface 20 of the substrate 12. A plated stud 22 is attached to a capture pad 24 of the PTH 10, as shown in FIG. 3. FIG. 4 illustrates an additional step after related art FIG. 3 wherein a dielectric material 18B is added to a top surface 26 of the substrate 12. A cavity 16 is formed in the dielectric material 18B by chemical etching, drilling or other mechanical method. The plated stud 22 is required to protect the dielectric material 18B from being removed by the chemical etching or drilling processes used during formation of the cavity 16. FIG. 5 illustrates related art FIG. 4 after an object 28, such as a microvia, is attached to the plated stud 22.

SUMMARY OF THE INVENTION

A first general aspect of the present invention provides a laser beam system comprising:

a laser system providing a bimodal focused beam, and wherein an energy density at a centroid of the beam is at least 10 percent less than the average energy density of the beam.

A second general aspect of this invention provides an apparatus comprising:

a laser source producing a laser beam; and a beam shaping lens for forming the laser beam into a bimodal focused beam wherein an area of reduced energy density at a centroid of the bimodal focused beam is at least 10% less than an average energy density of the bimodal focused beam.

A third general aspect of this invention provides a method comprising:

applying a focused laser beam onto a circuit board wherein the focused laser beam removes a dielectric above a surface of a capture pad of a Plated Through Hole (PTH) while maintaining the dielectric within the PTH to a substantially flush level with the surface of the capture pad.

BRIEF DESCRIPTION OF THE DRAWINGS

For an understanding of the present invention, reference should be made to the following detailed description taken in connection with the accompanying drawings wherein.

DETAILED DESCRIPTION OF THE INVENTION

Figure 1:
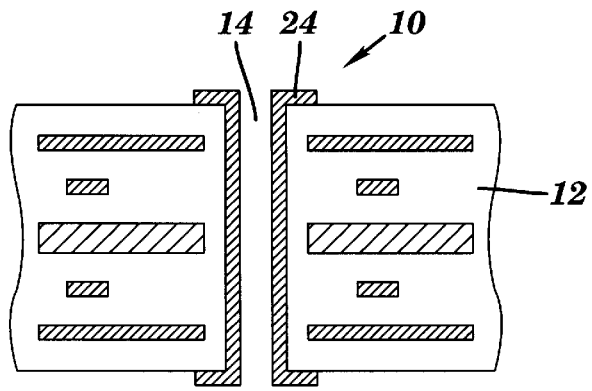
FIG. 1 illustrates a cross sectional view of a related art formation of a PTH in a substrate.
Figure 2:
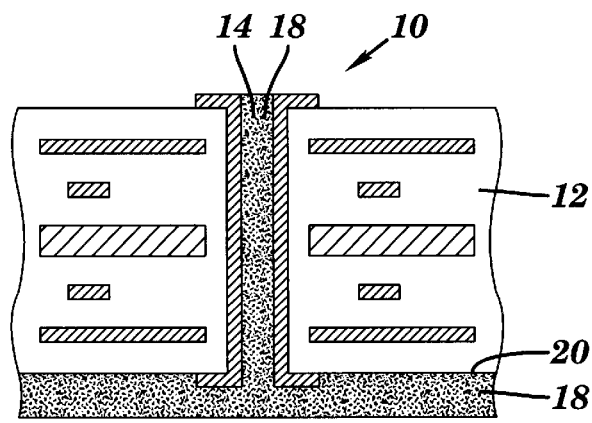
FIG. 2 illustrates the related art substrate of FIG. 1 having a dielectric on a lower surface of the substrate and within the PTH.
Figure 3:
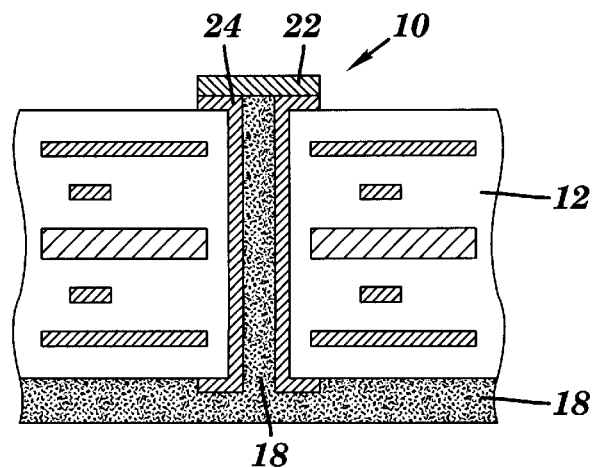
FIG. 3 illustrates the related art substrate of FIG. 2 having a plated stud over a capture pad of the PTH.
Figure 4:
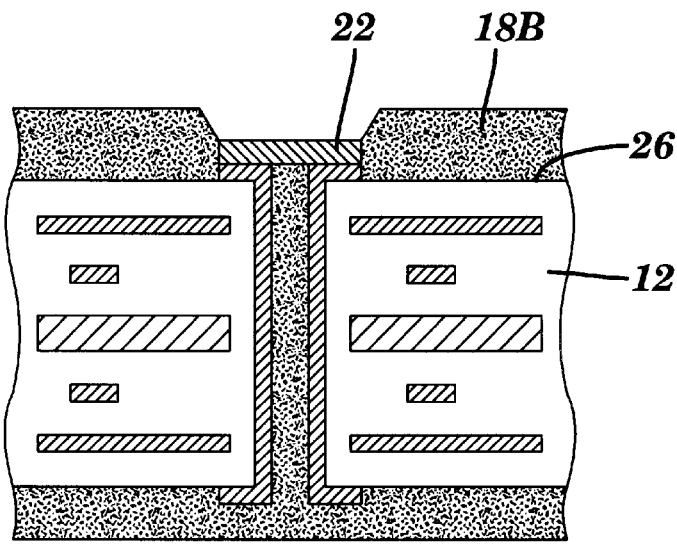
FIG. 4 illustrates the related art substrate of FIG. 3 having a dielectric on a top surface of the substrate.
Figure 5:
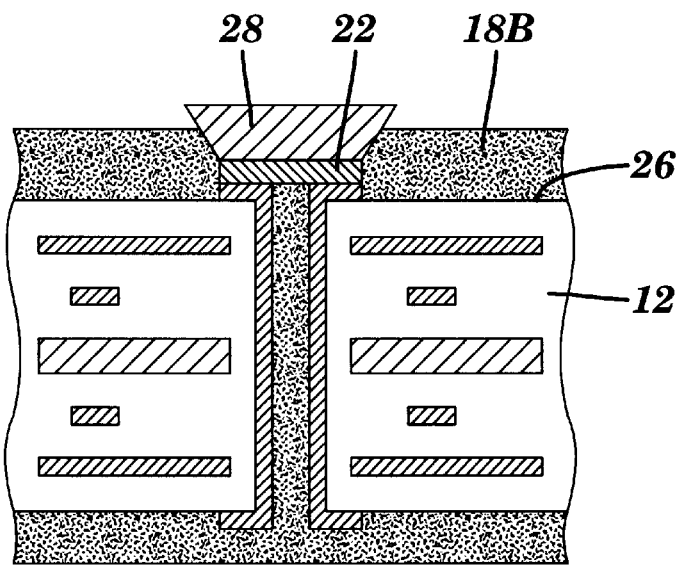
FIG. 5 illustrates the related art substrate of FIG. 4 having a microvia over the plated stud.
Figure 6:
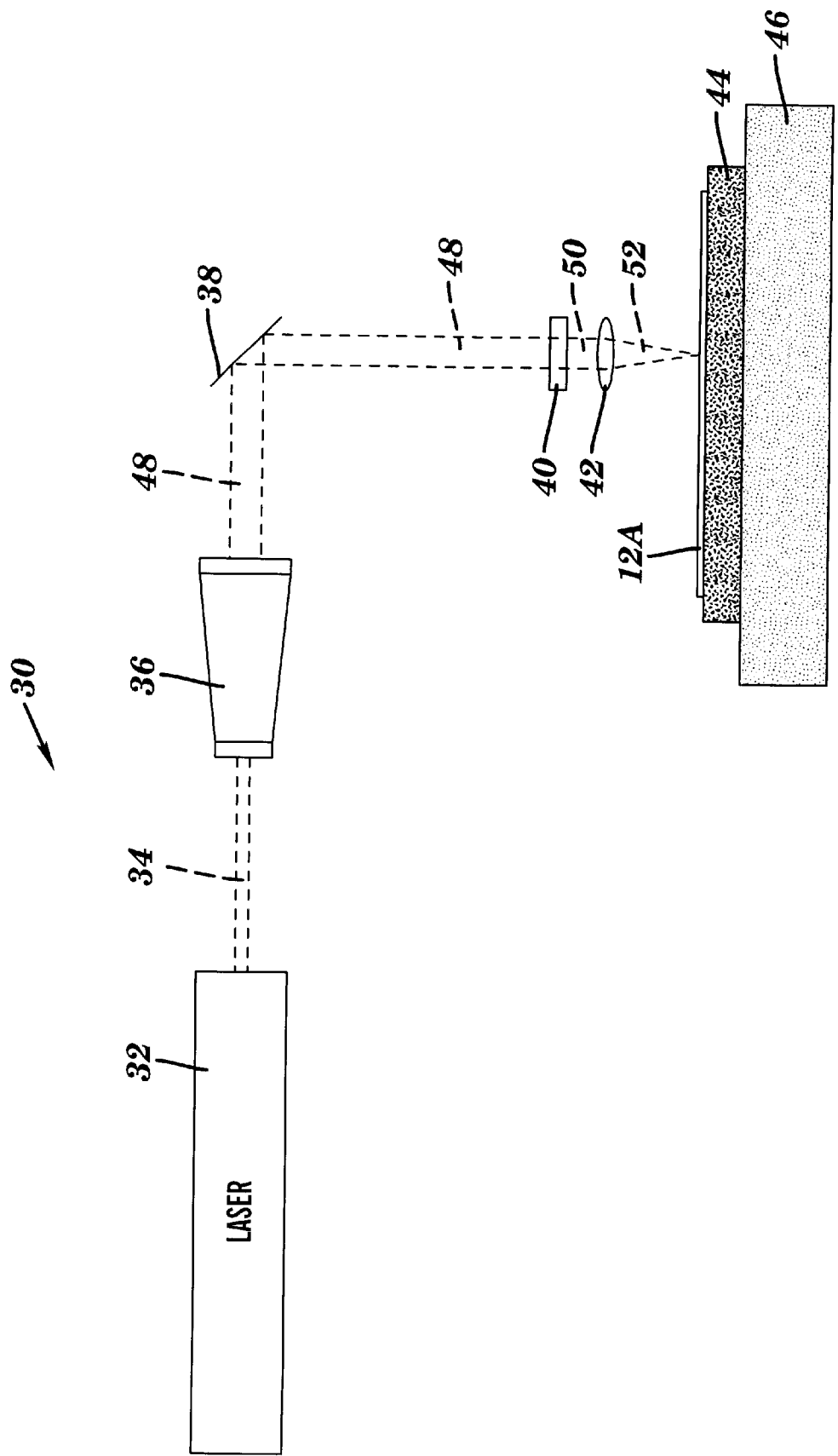
FIG. 6 illustrates a schematic view of a laser system for applying a bimodal focused laser beam to a surface of an object in accordance with the present invention.
Figure 11:
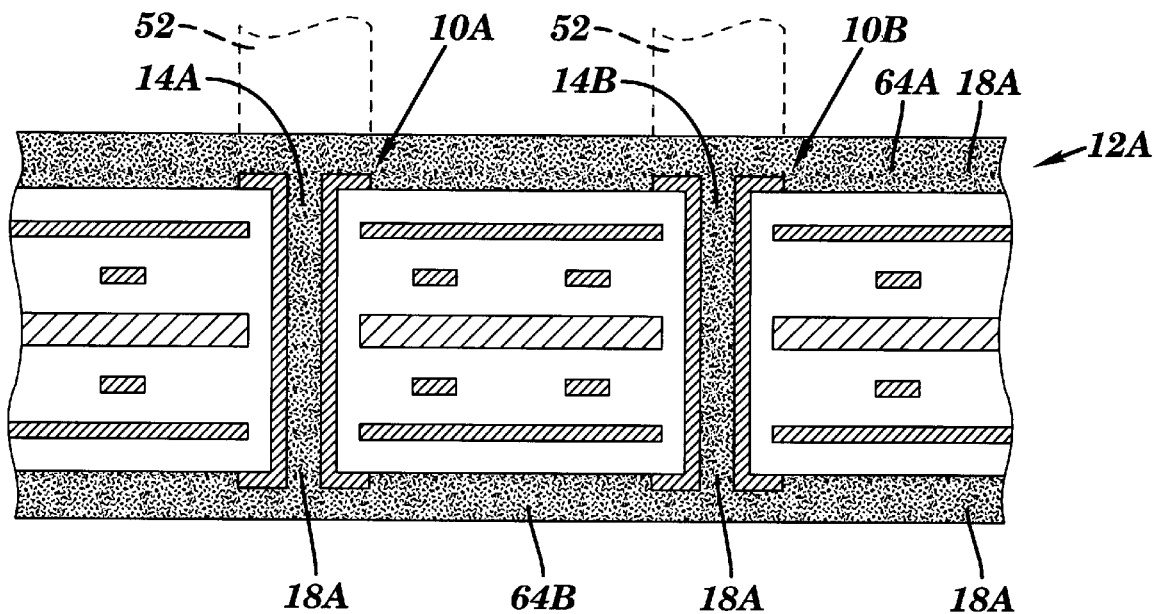
FIG. 11 illustrates a cross sectional view of a circuit board including a substrate, a PTH, and a dieclectric in accordance with the present invention.
Figure 12:
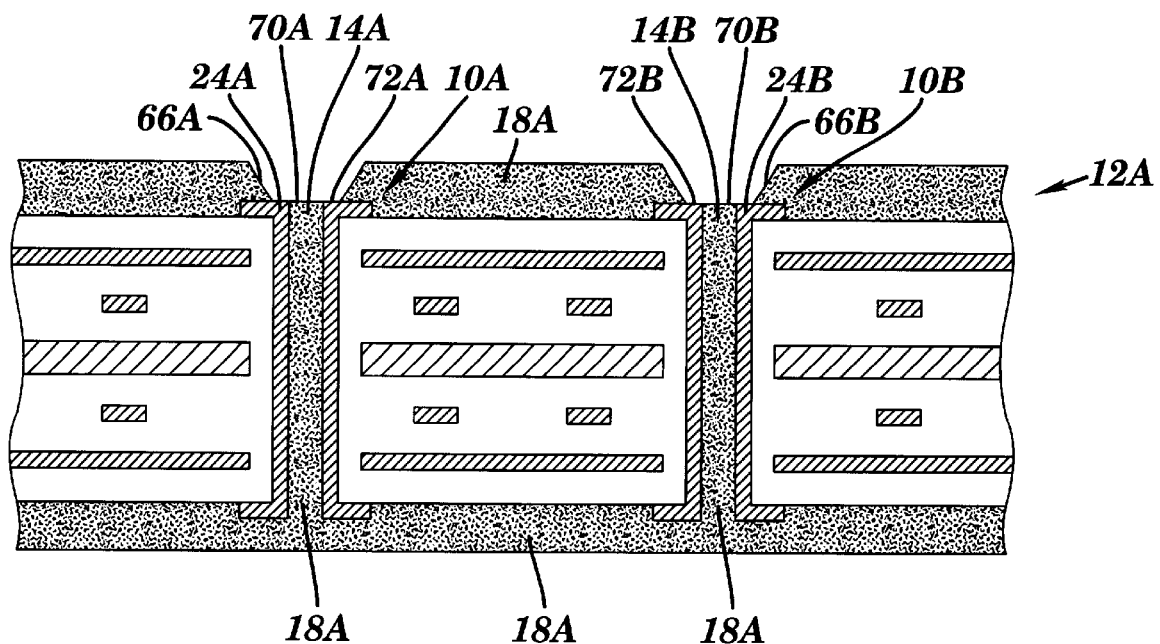
FIG. 12 illustrates FIG. 11 including a cavity created by the bimodal focused laser beam.
Figure 13:
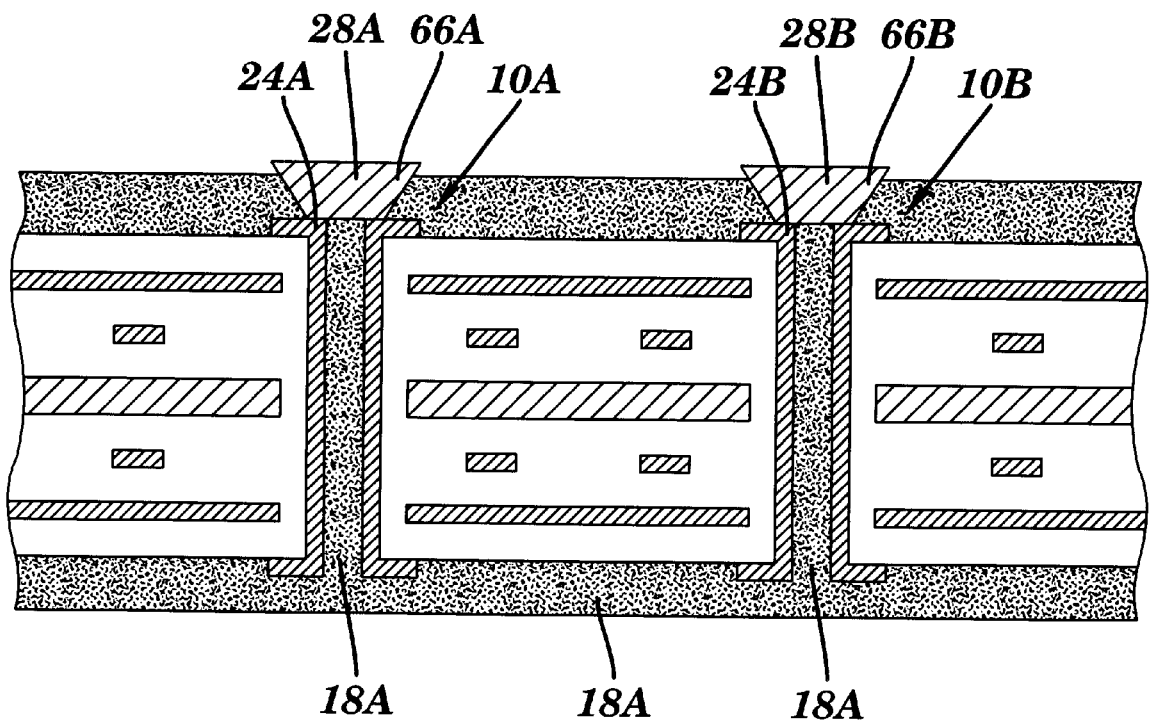
FIG. 13 illustrates FIG. 12 including a microvia attached to a capture pad of the PTH.

The present invention eliminates the related art steps that require a separate fill of the PTH (FIG. 2) and the overplate to form the plated stud 22 over the PTH 10 (FIG. 3). Also, the present invention eliminates the related art step of applying the dielectric material 18 over the top surface 26 of the substrate 12 (FIG. 4). Instead of using the related art mechanical methods to form the microvia, the present invention utilizes a laser system 30 (FIG. 6) to drill directly through a dielectric 18A to a capture pad 24A above a PTH 10A (FIGS. 11–13).

Figure 9:
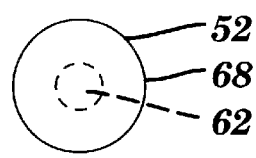
FIG. 9 illustrates a plan view of a bimodal focused laser beam of the present invention.
Figure 10:
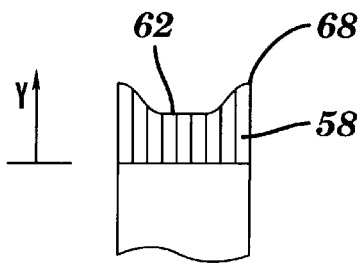
FIG. 10 illustrates a laser beam energy distribution for the bimodal focused laser beam.

The laser system 30 includes a laser source 32, a laser beam 34, a beam expander 36, a turning mirror 38, a beam shaping lens 40, a focusing lens 42, a vacuum chuck 44, and a motion system 46. The laser source 32 may be any suitable source such as a Nd: YAG laser operating at 355 nm. The laser source 32 produces a pulsed laser beam 34 that travels through the beam expander 36. The beam expander 36 creates a broadened laser beam 48 that is turned toward a substrate 12A by the turning mirror 38. After reflecting off of the turning mirror 38, the broadened laser beam 48 travels through the beam shaping lens 40. The beam shaping lens creates a bimodal laser beam 50 (FIGS. 9 and 10). The bimodal laser beam 50 passes through the focusing lens 42 that directs a focused bimodal laser beam 52 towards the substrate 12A. The focused bimodal laser beam 52 strikes the dielectric material 18A of the substrate 12A. The focused bimodal laser beam 52 strikes the substrate 12A, such that the focused bimodal laser beam 52 may be any suitable shape (e.g., circular, oval, etc.).

The vacuum chuck 44, attached to the motion system 46, securely holds the substrate 12A in place. The motion system 46 provides bidirectional movement to the substrate 12A. Thus, the motion system 46 moves the substrate 12A to a selected position where the focused bimodal laser beam 52 may be applied over each PTH (10A, 10B), as illustrated in FIG. 11.

FIG. 9 illustrates a plan view of the focused bimodal laser beam 52 of the present invention, and FIG. 10 illustrates a bimodal energy distribution 58 of the present invention. The energy density at a centroid 62 of the bimodal focused laser beam 52 is at least 10% less than the average-energy intensity of the bimodal focused laser beam 52. A high energy perimeter portion 68 of the bimodal focused laser beam 52 surrounds the centroid 62, as illustrated in FIGS. 9 and 10. The centroid 62 containing an area of reduced energy comprises at least 25% of the total area of the bimodal focused laser beam 52 (FIG. 9).

FIG. 11 illustrates the substrate 12A including PTHs 10A and 10B. A layer of dielectric material 18A is deposited on a top portion 64A and a bottom portion 64B of the substrate 12A using conventional deposition techniques, such as, lamination, coating, etc. Additionally, the dielectric material 18A fills an opening 14A and an opening 14B in the PTHs 10A and 10B, respectively, during deposition. The focused bimodal laser beam 52 is applied above the PTH 14A and than above the PTH 14B. As illustrated in FIG. 12, a cavity 66A and a cavity 66B are formed over the PTHs 10A and 10B, respectively, by the focused bimodal laser beam 52.

For example, in a single step, the focused bimodal laser beam 52, having the bimodal energy distribution (FIG. 10), forms the cavity 66A in the dielectric material 18A of the substrate 12A. The high energy perimeter portion 68 of the focused bimodal laser beam 52 assures that all the dielectric material 18A is removed over the capture pad 24A of the PTH 10A, while the area of reduced energy 62 of the laser beam 52 minimizes the dielectric material 18A removed within the opening 14A of the PTH 10A. Pulsing of the focused bimodal laser beam 52 assists in the removal of the dielectric material 18A. A surface 72A of the capture pad 24A is completely cleared of the dielectric material 18A (FIG. 12), and the level 70A of the dielectric material 18A within the opening 14A of the PTH 10A is substantially flush with the surface 72A of the capture pad 24A.

Similarly, the focused bimodal laser beam 52 forms a cavity 66B over the PTH 10B (FIG. 12). The focused bimodal laser beam 52 is positioned over the PTH 10B, and a cavity 66B is formed with a completely cleared surface 72B of the capture pad 24B, and leaving the level 70B of the dielectric material 18A within the opening 14B flush with the surface 72B of the capture pad 24B.

FIG. 13 illustrates the substrate 12A of FIG. 12 after the addition of an object 28A and an object 28B to the capture pads 24A and 24B, respectively. The objects 28A and 28B may comprise microvias formed for providing electrical connection between, e.g., substrates, cards, boards, microchips, etc.

Figure 7:
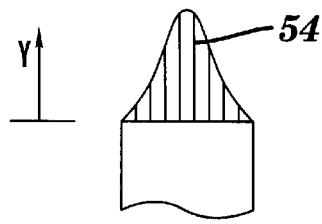
FIG. 7 illustrates a related art Gaussian laser beam energy distribution.
Figure 8:
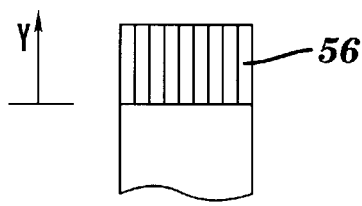
FIG. 8 illustrates a related art uniform laser beam energy distribution.

Alternatively, conventional laser beams, such as a laser having a Gaussian energy distribution 54, as illustrated in FIG. 7, or a laser having a uniform energy distribution 56, as illustrated in FIG. 8, may be used to remove the dielectric material 18A. (Note that the energy is plotted in a Y direction.) However, conventional Gaussian distribution and uniform distribution are less desirable because these energy distributions tend to remove dielectric material 18A within the opening 14A of the PTH 10A (FIG. 12), which may lead to reliability problems caused by entrapped plating solution.

While embodiments of the present invention have been described herein for purposes of illustration, many modifications and changes will become apparent to those skilled in the art. For example, the focused bimodal laser beam 52 may drill through any suitable material (e.g., glass/epoxy, organic dielectric, etc.). Accordingly, the appended claims are intended to encompass all such modifications and changes as fall within the true spirit and scope of this invention.

I claim:

1. An apparatus comprising:
 a laser system providing a bimodal focused beam, and wherein an energy density at a centroid of the beam is at least 10 percent less than the average energy density of the beam.

2. The apparatus of claim 1, wherein the bimodal focused beam is circular.

3. The apparatus of claim 1, wherein an area of reduced energy comprises at least 25 percent of a total beam area.

4. The apparatus of claim 3, wherein the bimodal focused beam strikes an object.

5. The apparatus of claim 4, wherein the object is a substrate.

6. The apparatus of claim 5, wherein the substrate further includes a Plated Through Hole (PTH) having a dielectric material therein, and a layer of dielectric material covering the surface of the substrate.

7. The apparatus of claim 6, wherein the bimodal focused beam forms a cavity in the dielectric material above a capture pad of the PTH wherein a surface of the capture pad of the PTH is uncovered.

8. The apparatus of claim 7, having a microvia formed in the cavity.

9. The apparatus of claim 1, wherein the bimodal focused beam comprises a Nd:YAG laser.

10. The apparatus of claim 9, wherein the bimodal focused beam produces a pulsed beam.

11. An apparatus comprising:
 a laser source producing a laser beam; and
 a beam shaping lens for forming the laser beam into a bimodal focused beam wherein an area of reduced energy density at a centroid of the bimodal focused beam is at least 10% less than an average. energy density of the bimodal focused beam.

12. The apparatus of claim 11, wherein the area of reduced energy comprises at least 25% of the total bimodal focused beam area.

13. The apparatus of claim 11, wherein the bimodal focused beam strikes a substrate.

14. The apparatus of claim 13, further including a vacuum chuck to hold the substrate.

15. The apparatus of claim 13, further including a motion system for providing a bidirectional movement of the substrate.

16. The apparatus of claim 11, wherein the substrate comprises a Plater Through Hole (PTH) having a dielectric therein and a layer of dielectric material over the PTH.

17. The apparatus of claim 16, wherein the bimodal focused beam creates a cavity in the layer of dielectric material over the PTH uncovering a capture pad of the PTH.

18. The apparatus of claim 11, wherein the bimodal focused laser beam comprises a pulsed Nd:YAG laser.

19. The apparatus of claim 11, further including a turning mirror for turning the laser beam towards a substrate.

20. The apparatus of claim 11, further including a beam expander for expanding the laser beam before the laser beam enters the beam shaping lens.

21. A method comprising:
 applying a focused laser beam onto a circuit board wherein the focused laser beam removes a dielectric above a surface of a capture pad of a Plated Through Hole (PTH) while maintaining the dielectric within the PTH to a substantially flush level with the surface of the capture pad.

22. The method of claim 21, wherein the focused laser beam is a bimodal circular beam wherein an energy density at a centroid of the bimodal circular beam is at least 10 percent less than the average energy density of the bimodal circular beam.

23. The method of claim 21, wherein an area of reduced energy comprises at least 25 percent of a total bimodal circular beam area.

24. The method of claim 21, wherein the focused beam comprises a pulsed Nd:YAG laser.

* * * * *